United States Patent
Lee

(10) Patent No.: US 7,018,907 B2
(45) Date of Patent: Mar. 28, 2006

(54) METHODS FOR FORMING SHALLOW TRENCH ISOLATION STRUCTURES

(75) Inventor: Jae Suk Lee, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 108 days.

(21) Appl. No.: 10/748,468

(22) Filed: Dec. 30, 2003

(65) Prior Publication Data

US 2004/0152280 A1 Aug. 5, 2004

(30) Foreign Application Priority Data

Dec. 30, 2002 (KR) ............. 10-2002-0086350
Dec. 30, 2002 (KR) ............. 10-2002-0086357

(51) Int. Cl.
*H01L 21/76* (2006.01)

(52) U.S. Cl. .................................. 438/430; 438/424

(58) Field of Classification Search ........... 438/424, 438/430

See application file for complete search history.

(56) References Cited

U.S. PATENT DOCUMENTS 6,566,228 B1 * 5/2003 Beintner et al. ............ 438/430
6,737,336 B1 * 5/2004 Ueno et al. ................. 438/430

* cited by examiner

*Primary Examiner*—Bradley K. Smith
(74) *Attorney, Agent, or Firm*—Hanley, Flight & Zimmerman, LLC

(57) ABSTRACT

Methods for forming shallow trench isolation structures are disclosed. In a disclosed example, after a trench is formed in a substrate, an oxide layer is formed on sidewalls and a bottom of the trench. Then, a metal or poly-silicon layer is formed on the oxide layer. Next, a portion of the metal or poly-silicon layer is etched such that the oxide layer on the bottom of the trench is exposed, while leaving the metal or poly-silicon layer on the sidewalls of the trench. Finally, a dielectric material layer is deposited to fully fill the trench.

17 Claims, 4 Drawing Sheets

METHODS FOR FORMING SHALLOW TRENCH ISOLATION STRUCTURES

FIELD OF THE DISCLOSURE

The present disclosure relates generally to semiconductor devices; and, more particularly, to methods for forming shallow trench isolation structures.

BACKGROUND

In semiconductor devices such as transistors, an isolation region is needed to prevent leakage current from occurring between devices. Shallow trench isolation (STI) structures have been widely used to form these isolation regions in semiconductor devices.

The STI structures are generally formed as follows. A pad dielectric pattern is formed on a silicon substrate. Shallow trenches are formed by etching the silicon substrate using the pad dielectric pattern as a mask. A dielectric layer is deposited to fill the trench. A planarization process is performed on the dielectric layer.

However, during such a procedure, the pad dielectric pattern may be easily damaged during the etching process of the silicon substrate. This damage causes a leakage problem in the devices.

DETAILED DESCRIPTION

Figure 1A:
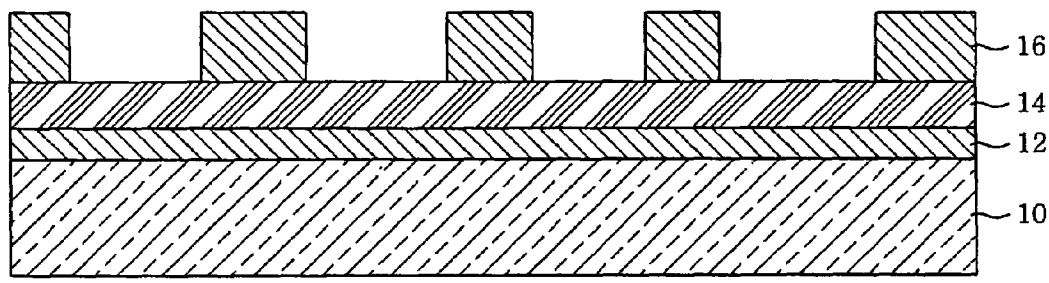
FIGS. 1A to 1G are cross-sectional views illustrating example processes of manufacturing a shallow trench isolation structure in accordance with the teachings of the present disclosure.

FIG. 1A shows a formation of a LP-TEOS (Low Pressure Tetra Ethyl Ortho Silicate) oxide layer 12 and a nitride layer 14 on a surface of a substrate 10 by using, for example, LPCVD (Low Pressure Chemical Vapor Deposition) in sequence. The LP-TEOS oxide layer 12 and the nitride layer 14 have thicknesses ranging from about 1000 to 5000 angstroms and from about 1000 to 10000 angstroms, respectively. Further, in the LPCVD process, the LP-TEOS oxide layer 12 or the nitride layer 14 is preferably formed at a temperature ranging from about 800 to 1200° C. and a pressure ranging from about 0 to 5 torr.

Next, a PR (Photo Resist) pattern 16 is formed on the nitride layer 14 to define trench regions thereon. The thickness of the PR pattern 16 preferably ranges from about 1000 to 10000 angstroms.

Figure 1B:
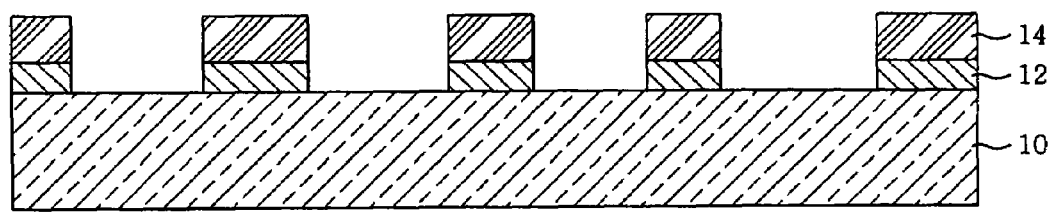

With reference to FIG. 1B, using the PR pattern 16 as a mask, the LP-TEOS oxide layer 12 and the nitride layer 14 are then etched to thereby form a LP-TEOS oxide pattern 12 and a nitride pattern 14. The etching process may be performed by using, for example, an RIE (Reactive Ion Etching) method. The PR pattern 16 is then removed or stripped.

Figure 1C:
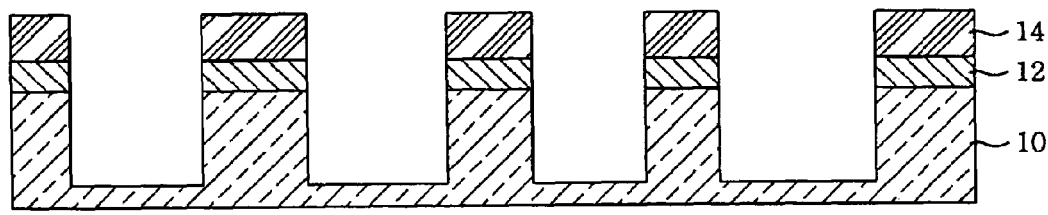

Subsequently, as shown in FIG. 1C, trenches are formed through the LP-TEOS oxide layer 12 and the nitride layer 14 and partially into the substrate 10. The substrate 10 is etched to a predetermined depth using the nitride pattern 14 as a mask. The etching process may be carried out by using an RIE method. An etched part of the substrate 10, the LP-TEOS oxide pattern 12, and the nitride pattern 14 form a hollow space, (i.e., a trench). The depth of the trench preferably ranges from about 2000 to 6000 angstroms. Further, the trench has sidewalls and a bottom.

Figure 1D:
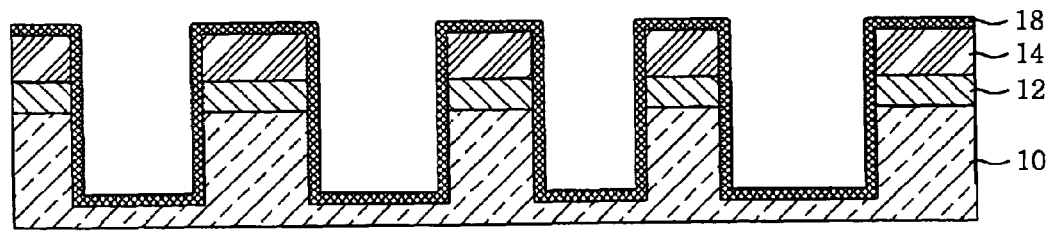

Thereafter, an oxide layer 18 is formed on an entire surface of the device, (i.e., on the surface of the nitride pattern 14 and the surface of the sidewalls and the bottom of the trench) as shown in FIG. 1D. The oxide layer 18 may contain LP-TEOS oxide or thermal oxide and have a thickness ranging from about 100 to 1000 angstroms.

Figure 1E:
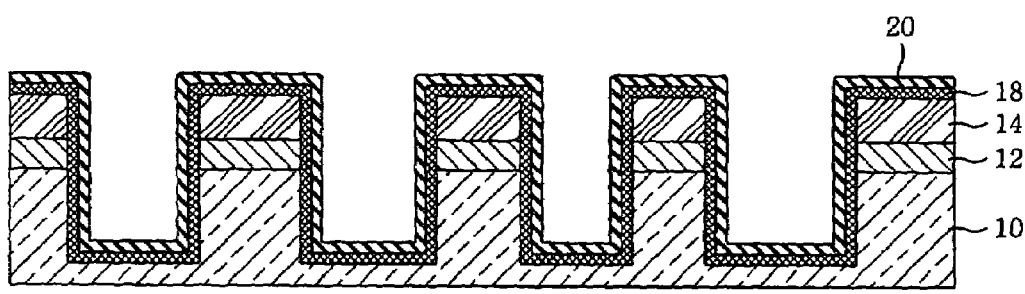

Referring to FIG. 1E, a metal or poly-silicon layer 20 is formed on the oxide layer 18 through the use of, for example, a sputtering process. Further, the metal or poly-silicon layer 20 may contain poly-silicon, laminated metal of Ti, TiN and W or laminated metal of Ta, TaN and W. The laminated metal of Ti, TiN and W is formed by sequentially laminating Ti, TiN and W layers. The preferred thicknesses of the Ti, TiN and W layers range from about 30 to 100 angstroms, from about 50 to 200 angstroms, and from about 50 to 200 angstroms, respectively. Further, the laminated metal of Ta, TaN and W is made by sequentially laminating Ta, TaN and W layers. The preferred thicknesses of Ta, TaN and W layers are equivalent to those of Ti, TiN and W layers, respectively. When poly-silicon is used to form the metal or poly-silicon layer 20, the preferred thickness ranges from about 100 to 300 angstroms.

Figure 1F:
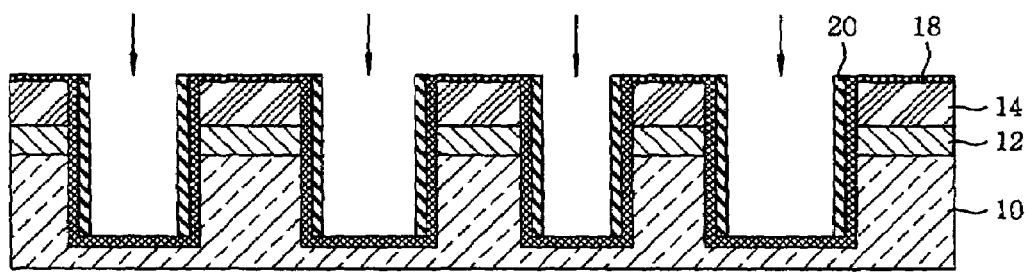

Referring to FIG. 1F, portion(s) of the metal or poly-silicon layer 20 are removed such that the oxide layer 18 on the bottom of the trench(es) are exposed, while leaving the metal or poly-silicon layer 20 on the sidewalls of the trench(es).

In a first example, each of the sidewalls of the metal or poly-silicon layer 20 may act as a floating metal or floating poly-silicon. That is the sidewalls are separated from each other.

Figure 1G:
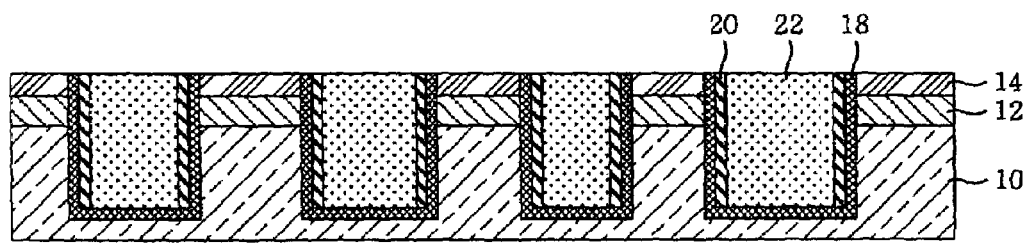

With reference to FIG. 1G, a dielectric material layer 22, (e.g., an oxide layer), is deposited to fully fill the trench(es) by using an HDP CVD (High Density Plasma Chemical Vapor Deposition) or an $O_3$-TEOS CVD (Ozone - Tetra Ethyl Ortho Silicate Chemical Vapor Deposition) method. Next, a planarization process, (e.g., a chemical mechanical planarization), may be performed. That is, the dielectric material layer 22 is polished until a surface of the nitride pattern 14 is exposed. Consequently, the first example STI structures are completed.

The sidewalls of the metal or poly-silicon layer 20 may trap electrons to thereby prevent the electrons from moving. That is, the sidewalls may accumulate charges to thereby reduce leakage between semiconductor devices.

In the following, a second example process will be described in detail with reference to FIGS. 2A to 2G. In the second example, the processes of forming the LP-TEOS oxide layer 12 and the nitride layer 14 and forming the trench(es) are the same as those of the above-described with respect to the example of FIGS. 1A–1C. Therefore, in the interest of avoiding undue repetition, only the processes following the formation process of the trench(es) will be described for the second example, and the processes associated with FIGS. 2A–2C will not be repeated here. Instead, the interested reader is referred to the description of FIGS. 1A–1C for a description of the processes illustrated in FIGS. 2A–2C.

Figure 2A:
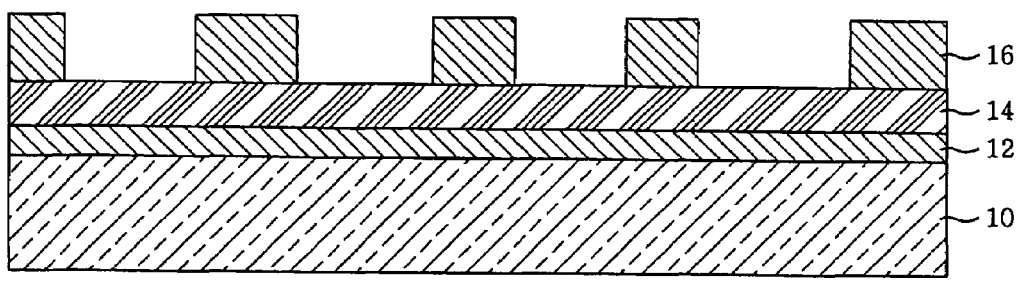
FIGS. 2A to 2G are cross-sectional views illustrating example processes of manufacturing a shallow trench isolation structure in accordance with the teachings of the present disclosure.
Figure 2B:
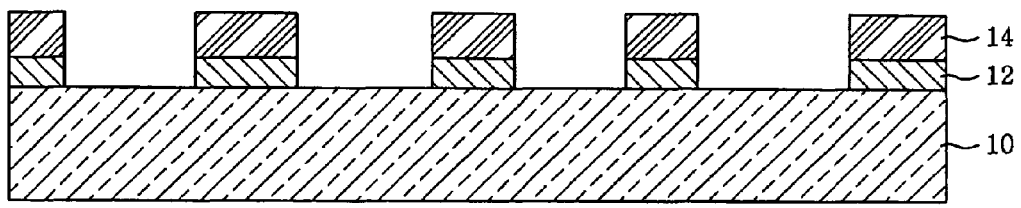
Figure 2C:
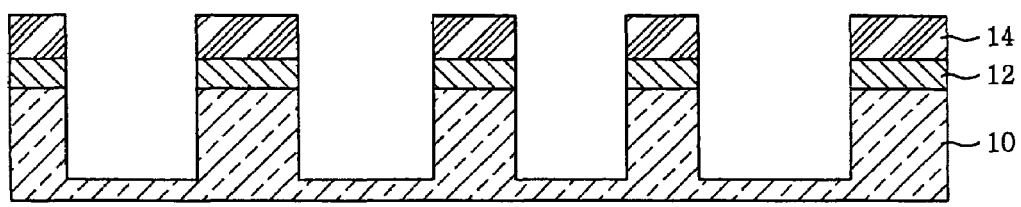
Figure 2D:
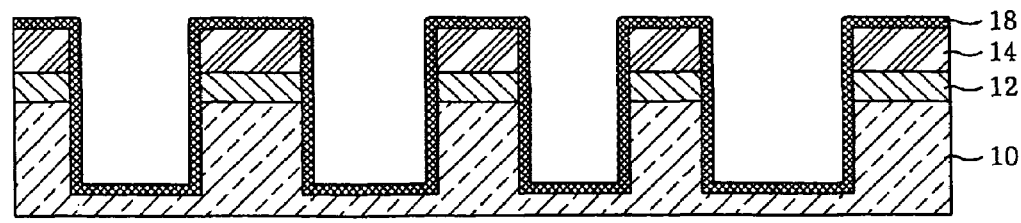

With reference to FIG. 2D, a first oxide layer 18 is formed on the entire surface of the device, (i.e., a surface of the nitride pattern 14 and a surface of the sidewalls and the bottom of the trench(es)). The first oxide layer 18 may contain LP-TEOS oxide or thermal oxide and have a thickness ranging from about 100 to 1000 angstroms.

Figure 2E:
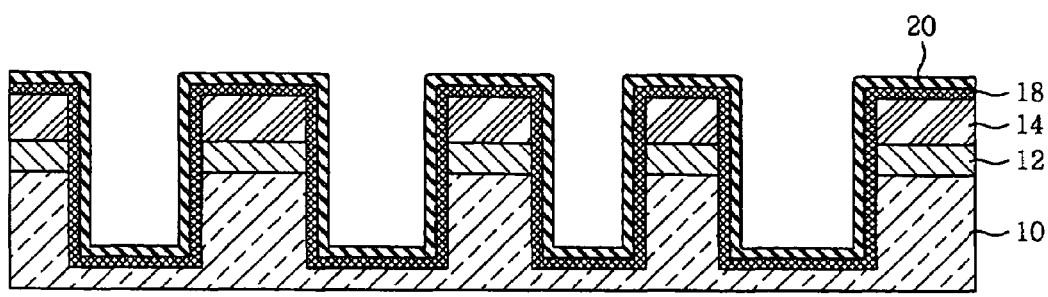

Referring to FIG. 2E, a second oxide layer 20 is formed on the first oxide layer 18 and contains, for example, HDP CVD oxide or $O_3$-TEOS oxide. The second oxide layer 20 may have a thickness ranging from about 100 to 1000 angstroms.

Figure 2F:
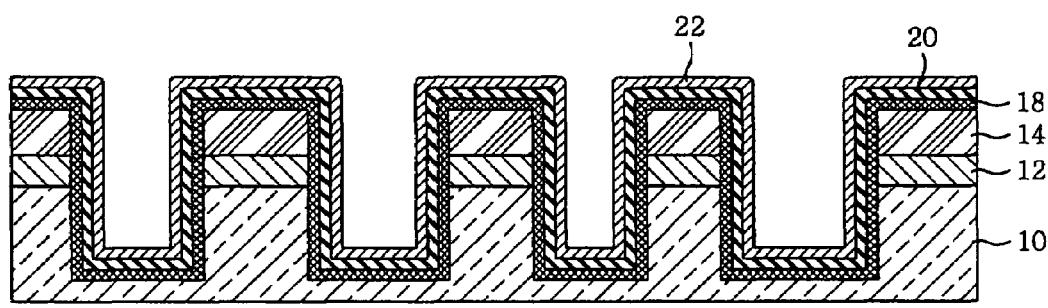

Referring to FIG. 2F, a PSG (Phosphor Silicon Glass) layer 22 is formed on the second oxide layer 20 by using an HDP CVD or $O_3$-TEOS CVD method. Preferably, the PSG layer has a thickness ranging from about 100 to 100 angstroms.

Figure 2G:
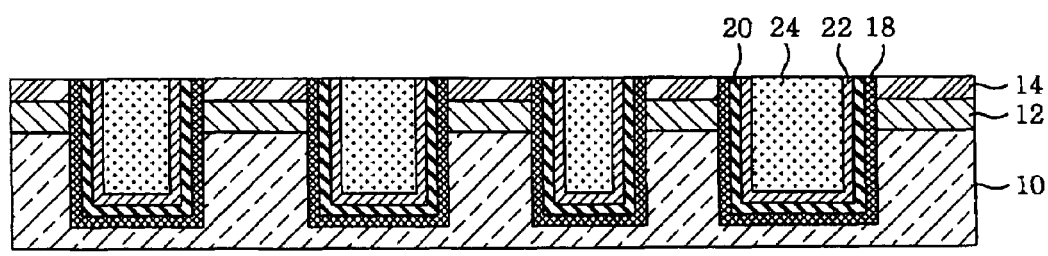

Referring to FIG. 2G, a USG (Undoped Silicon Glass) layer 24 is deposited to fully fill the trench(es) by using an HDP CVD or $O_3$-TEOS CVD method. Next, a planarization process, (e.g., a chemical mechanical planarization), may be performed. That is, the USG layer 24 is polished until a surface of the nitride pattern 14 is exposed. Consequently, the second example STI structures are completed.

In the second example, the PSG layer 22 may act in the same manner as the sidewalls of the metal or poly-silicon layer 20 does in the first example. That is, the PSG layer 22 may accumulate charges to thereby reduce leakage between the semiconductor devices.

From the foregoing, persons of ordinary skill in the art will appreciate that the above disclosed methods form a shallow trench isolation structure having reduced leakage by inserting floating metal or floating poly-silicon into a shallow trench structure.

In a disclosed example, a trench is formed in a substrate and then an oxide layer is formed on sidewalls and a bottom of the trench. Thereafter, a metal or poly-silicon layer is formed on the oxide layer. Next, a portion of the metal or poly-silicon layer is etched such that the oxide layer on the bottom of the trench is exposed, while leaving the metal or poly-silicon layer on the sidewalls of the trench. Finally, a dielectric material layer is deposited to fully fill the trench.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a shallow trench isolation structure in a semiconductor device comprising:
   forming a trench in a substrate;
   forming an oxide layer on sidewalls and a bottom of the trench;
   forming a metal or poly-silicon layer on the oxide layer;
   etching a portion of the metal or poly-silicon layer to expose the oxide layer on the bottom of the trench while leaving the metal or poly-silicon layer on the sidewalls of the trench; and
   depositing a dielectric material layer to fill the trench, wherein forming the trench in the substrate comprises:
   forming a LP-TEOS (Low Pressure Tetra Ethyl Ortho Silicate) oxide layer on a surface of the substrate;
   forming a nitride layer on the LP-TEOS oxide layer;
   forming a PR pattern on the nitride layer;
   forming a LP-TEOS oxide pattern and a nitride pattern by etching the LP-TEOS oxide layer and the nitride layer using the PR pattern as a mask;
   removing the PR pattern; and
   etching the substrate to a predetermined depth using the nitride pattern as a mask.

2. A method as defined in claim 1, wherein the trench is formed in the substrate by an RIE (Reactive Ion Etching) method.

3. A method as defined in claim 1, wherein the oxide layer contains LP-TEOS oxide or thermal oxide.

4. A method as defined in claim 1, wherein the metal or poly-silicon layer contains poly-silicon, a laminated metal of Ti, TiN and W, or a laminated metal of Ta, TaN and W.

5. A method as defined in claim 1, wherein the dielectric material layer contains oxide.

6. A method as defined in claim 1, wherein the dielectric material layer is deposited by using an HDP CVD (High Density Plasma Chemical Vapor Deposition) method or an $O_3$-TEOS CVD (Ozone-Tetra Ethyl Ortho Silicate Chemical Vapor Deposition) method.

7. A method as defined in claim 1, wherein forming the LP-TEOS oxide layer on the surface of the substrate and forming the nitride layer on the LP-TEOS oxide layer are performed by using a LPCVD (Low Pressure Chemical Vapor Deposition) method.

8. A method as defined in claim 1, wherein forming the LP-TEOS oxide pattern and the nitride pattern by etching the LP-TEOS oxide layer and the nitride layer is performed by an RIE method.

9. A method for forming a shallow trench isolation structure comprising:
   (a) forming a trench in a substrate;
   (b) forming a first oxide layer on sidewalls and a bottom of the trench;
   (c) forming a second oxide layer on the first oxide layer;
   (d) forming a PSG (Phosphor Silicon Glass) layer on the second oxide layer; and
   (e) depositing a USG (Undoped Silicon Glass) layer to fill the trench.

10. A method as defined in claim 9, wherein the trench is formed in the substrate by an RIE method.

11. A method as defined in claim 9, wherein the first oxide layer contains LP-TEOS oxide or thermal oxide.

12. A method as defined in claim 9, wherein the second oxide layer contains HDP CVD oxide or $O_3$-TEOS oxide.

13. A method as defined in claim 9, wherein the PSG layer is deposited by an HDP CVD or $O_3$-TEOS CVD method.

14. A method as defined in claim 9, wherein the USG layer is deposited by an HDP CVD or $O_3$-TEOS CVD method.

15. A method as defined in claim 9, wherein forming the trench in the substrate comprises:
   forming a LP-TEOS (Low Pressure Tetra Ethyl Ortho Silicate) oxide layer on a surface of the substrate;
   forming a nitride layer on the LP-TEOS oxide layer;
   forming a PR pattern on the nitride layer;
   forming a LP-TEOS oxide pattern and a nitride pattern by etching the LP-TEOS oxide layer and the nitride layer using the PR pattern as a mask;
   removing the PR pattern; and
   etching the substrate to a predetermined depth using the nitride pattern as a mask.

16. A method as defined in claim 15, wherein forming the LP-TEOS oxide layer on the surface of the substrate and forming the nitride layer on the LP-TEOS oxide layer are performed by an LPCVD method.

17. A method as defined in claim 15, wherein forming the LP-TEOS oxide pattern and the nitride pattern by etching the LP-TEOS oxide layer and the nitride layer is performed by an RIE method.

* * * * *